(12) United States Patent
Narita et al.

(10) Patent No.: US 9,728,609 B2
(45) Date of Patent: Aug. 8, 2017

(54) LAYERED SUBSTRATE WITH A MISCUT ANGLE COMPRISING A SILICON SINGLE CRYSTAL SUBSTRATE AND A GROUP-III NITRIDE SINGLE CRYSTAL LAYER

(71) Applicants: KABUSHIKI KAISHA TOYOTA CHUO KENKYUSHO, Nagakute-shi, Aichi-ken (JP); DENSO CORPORATION, Kariya-shi, Aichi-ken (JP)

(72) Inventors: Tetsuo Narita, Nisshin (JP); Kenji Ito, Nagoya (JP); Kazuyoshi Tomita, Nagoya (JP); Nobuyuki Otake, Nukata-gun (JP); Shinichi Hoshi, Okazaki (JP); Masaki Matsui, Nagoya (JP)

(73) Assignees: KABUSHIKI KAISHA TOYOTA CHUO KENKYUSHO, Nagakute (JP); DENSO CORPORATION, Kariya (JP)

(*) Notice: Subject to any disclaimer, the term of this patent is extended or adjusted under 35 U.S.C. 154(b) by 161 days.

(21) Appl. No.: 14/389,185

(22) PCT Filed: Nov. 1, 2012

(86) PCT No.: PCT/JP2012/078390
§ 371 (c)(1),
(2) Date: Sep. 29, 2014

(87) PCT Pub. No.: WO2013/145404
PCT Pub. Date: Oct. 3, 2013

(65) Prior Publication Data
US 2015/0053996 A1 Feb. 26, 2015

(30) Foreign Application Priority Data

Mar. 28, 2012 (JP) .................. 2012-074182

(51) Int. Cl.
*H01L 29/15* (2006.01)
*H01L 29/20* (2006.01)
(Continued)

(52) U.S. Cl.
CPC .......... *H01L 29/2003* (2013.01); *C30B 25/08* (2013.01); *C30B 25/183* (2013.01);
(Continued)

(58) Field of Classification Search
CPC ......... H01L 21/02378; H01L 21/02573; H01L 29/2003; H01L 21/02381; H01L 21/02433;
(Continued)

(56) References Cited

U.S. PATENT DOCUMENTS 5,838,029 A 11/1998 Shakuda
6,045,626 A 4/2000 Yano et al.
(Continued)

FOREIGN PATENT DOCUMENTS

CN    1983522 A   6/2007
JP    A-8-64913   3/1996
(Continued)

OTHER PUBLICATIONS

Keller, S. et al., "Growth and characterization of N-polar GaN and AlGaN/GaN HEMTs on (111) silicon," Phys. Status Solidi C, Jul. 9, 2011, pp. 2086-2088, vol. 8, No. 7-8.
(Continued)

*Primary Examiner* — Trung Q Dang
*Assistant Examiner* — Patricia Reddington
(74) *Attorney, Agent, or Firm* — Oliff PLC

(57) ABSTRACT

A step-flow growth of a group-III nitride single crystal on a silicon single crystal substrate is promoted. A layer of oxide oriented to a <111> axis of silicon single crystal is formed on a surface of a silicon single crystal substrate, and group-
(Continued)

III nitride single crystal is crystallized on a surface of the layer of oxide. Thereupon, a <0001> axis of the group-III nitride single crystal undergoing crystal growth is oriented to a c-axis of the oxide. When the silicon single crystal substrate is provided with a miscut angle, step-flow growth of the group-III nitride single crystal occurs. By deoxidizing a silicon oxide layer formed at an interface of the silicon single crystal and the oxide, orientation of the oxide is improved.

14 Claims, 8 Drawing Sheets

(51) Int. Cl.

| | | |
|---|---|---|
| C30B 29/40 | (2006.01) | |
| H01L 21/02 | (2006.01) | |
| C30B 25/08 | (2006.01) | |
| C30B 25/18 | (2006.01) | |
| H01L 29/04 | (2006.01) | |
| H01L 33/00 | (2010.01) | |

(52) U.S. Cl.
CPC .......... *C30B 29/403* (2013.01); *C30B 29/406* (2013.01); *H01L 21/0254* (2013.01); *H01L 21/02381* (2013.01); *H01L 21/02433* (2013.01); *H01L 21/02488* (2013.01); *H01L 29/045* (2013.01); *H01L 33/007* (2013.01)

(58) Field of Classification Search
CPC .......... H01L 21/02488; H01L 21/0254; H01L 29/045; H01L 33/007; C30B 25/08; C30B 25/183; C30B 29/403; C30B 29/406
USPC .......................................................... 257/76
See application file for complete search history.

(56) References Cited

U.S. PATENT DOCUMENTS

| | | | |
|---|---|---|---|
| 6,087,681 | A | 7/2000 | Shakuda |
| 6,376,866 | B1 | 4/2002 | Shakuda |
| 2002/0125492 | A1 | 9/2002 | Shakuda |
| 2004/0079960 | A1 | 4/2004 | Shakuda |
| 2005/0260357 | A1 | 11/2005 | Olsen et al. |
| 2006/0019033 | A1 | 1/2006 | Muthukrishnan et al. |
| 2006/0062917 | A1 | 3/2006 | Muthukrishnan et al. |
| 2006/0153995 | A1 | 7/2006 | Narwankar et al. |
| 2007/0072324 | A1 | 3/2007 | Krames et al. |
| 2007/0246802 | A1* | 10/2007 | Xianyu ............. H01L 21/02381 257/637 |
| 2009/0246944 | A1 | 10/2009 | Keller et al. |
| 2011/0027975 | A1 | 2/2011 | Krames et al. |

FOREIGN PATENT DOCUMENTS

| | | |
|---|---|---|
| JP | A-11-260835 | 9/1999 |
| JP | A-2000-247789 | 9/2000 |
| JP | A-2002-50585 | 2/2002 |
| JP | A-2003-332242 | 11/2003 |
| JP | A-2004-51446 | 2/2004 |
| JP | 2005-506695 A | 3/2005 |
| JP | A-2007-96331 | 4/2007 |
| JP | A-2008-227338 | 9/2008 |
| JP | 2008-305977 A | 12/2008 |
| JP | A-2009-231550 | 10/2009 |
| JP | 2010-114450 A | 5/2010 |
| WO | 03/033781 A1 | 4/2003 |

OTHER PUBLICATIONS

Saito, K. et al., "Measurement of misorientation of AlN layer grown on (111)Si for freestanding substrate," Phys. Status Solidi C, Jun. 14, 2009, pp. S293-S296, vol. 6, No. S2.
Lee, W. et al., "Growth and structural characteristics of GaN/AlN/nanothick gamma-Al2O3/Si (111)," J. Vac. Sci. Technol. B, May/Jun. 2008, pp. 1064-1067, vol. 26, No. 3.
Wakahara, A. et al., "Organometallic vapor phase epitaxy of GaN on Si(111) with a gamma-Al2O3(111) epitaxial intermediate layer," Journal of Crystal Growth, Mar. 2002, pp. 21-25, vol. 236, No. 1-3.
Sep. 1, 2015 extended Search Report issued in European Patent Application No. 12873342.5.
Nakajima, K., "Mechanism of Epitaxial Growth," *Kyoritsu Shuppan*, 2003, pp. 148-150 (with translation).
Hu, W. et al., "Mobility enhancement of 2DEG in MOVPE-grown AlGaN/AlN/GaN HEMT structure using vicinal (0 0 0 1) sapphire," *Superlattices and Microstructures*, 2009, pp. 812-816, vol. 46.
Matsushita, K. et al., "Influence of SiC Substrate Misorientation on AlGaN/GaN HEMTs Performance," *The Institute of Electronics, Information and Communication Engineers Technical Report*, Jun. 2009, pp. 69-72, vol. 109, No. 81.
Shen, X.Q. et al., "Surface step morphologies of GaN films grown on vicinal sapphire (0 0 0 1) substrates by rf-MBE," *Journal of Crystal* Growth, 2007, pp. 75-78, vol. 300.
Nishida, T. et al., "Step-flow Movpe of GaN on SiC substrates," *Journal of Crystal Growth*, 1998, pp. 41-47, vol. 195.
Watanabe, A. et al., "The growth of single crystalline GaN on a Si substrate using AlN as an intermediate layer," *Journal of Crystal Growth*, 1993, pp. 391-396, vol. 128.
Reiher, F. et al., "Metalorganic vapor-phase epitaxy of GaN layers on Si substrates with Si (1 1 0) and other high-index surfaces," *Journal of Crystal Growth*, 2010, pp. 180-184, vol. 312.
Lee, S.R. et al., "Effect of threading dislocations on the Bragg peakwidths of GaN, AlGaN, and AlN heterolayers," *Applied Physics Letters*, 2005, pp. 241904-1 to 241904-3, vol. 86.
International Search Report issued in International Application No. PCT/JP2012/078390 on Dec. 11, 2012 (with translation).
Written Opinion of the International Searching Authority issued in International Application No. PCT/JP2012/078390 on Dec. 11, 2012 (with translation).
Mar. 15, 2016 Office Action issued in Chinese Patent Application No. 201280072011.X.
Luo, X.H, et al., "Microstructural and compositional characteristics of GaN films grown on a ZnO-buffered Si (111) wafer," Micron, 2004, pp. 475-480, vol. 35.
Suzuki, N. et al., "HVPE growth of semi-polar (1122)GaN on GaN template (113)Si substrate," Journal of Crystal Growth, 2009, pp. 2875-2878, vol. 311.
Tanikawa, T. et al., "Reduction of dislocations in a (1122)GaN grown by selective MOVPE on (113)Si," Journal of Crystal Growth, 2009, pp. 2879-2882, vol. 311.
Yang, Min, et al., "Maskless selective growth of semi-polar (1122) GaN on Si (311) substrate by metal organic vapor phase epitaxy," Journal of Crystal Growth, 2009, pp. 2914-2918, vol. 311.
Nov. 4, 2015 Office Action issued in Japanese Patent Application No. 2014-507315.

* cited by examiner (a)

(b)

(c)

(1)

(2)

(3)

LAYERED SUBSTRATE WITH A MISCUT ANGLE COMPRISING A SILICON SINGLE CRYSTAL SUBSTRATE AND A GROUP-III NITRIDE SINGLE CRYSTAL LAYER

TECHNICAL FIELD

In the present specification, a technique is taught for promoting a step-flow growth of a group-III nitride single crystal layer on a surface of a silicon single crystal substrate. According to this technique, the group-III nitride single crystal layer having few crystal defects is grown on the surface of the silicon single crystal substrate.

BACKGROUND ART

As disclosed in Non-Patent Document 1 listed in [0010], a step-flow growth is known in one mode of crystal growth. In the present specification, crystal growth in the step-flow mode is called step-flow growth. As shown schematically in FIG. 8, a repeating shape of a step 28 and a terrace 26 is observed on a surface of a single crystal in step-flow growth. When crystal growth conditions are arranged, crystal growth proceeds at the positions of the steps 28, and the positions of the steps 28 proceed as shown by the arrow 30. When the step 28 reaches an end 32, a single crystal layer 24 has become thicker by the height of the step 28. Moreover, the height of the steps 28 and the inclination angle of the terraces 26 of FIG. 8 are shown in an exaggerated manner; the actual height of the steps 28 is between one and several atomic layers, and the inclination angle of the terraces 26 is extremely small.

In addition to step-flow growth, the two-dimensional nucleation and growth is also known. FIG. 9 schematically shows the surface of a single crystal layer during two-dimensional nucleation and growth. In two-dimensional nucleation and growth, crystal growth starts at a random location of a flat surface. Since the start position of crystal growth is determined probabilistically, on a surface 18 of a single crystal layer grown by two-dimensional nucleation and growth, planes 18a, 18b, 18c, etc. having different heights coexist, and a level difference 20 travels irregularly.

It is known that a surface of a single crystal layer grown by step-flow growth is flatter than a surface of a single crystal layer grown by two-dimensional nucleation and growth. Further, step-flow growth is easier to control than two-dimensional nucleation and growth. For example, in case of growing a single crystal doped with impurities, the concentration of impurities, and the position of impurities in the crystal structure, etc. can be managed more strictly by step-flow growth than by two-dimensional nucleation and growth. In the present specification, obtaining a result of crystal growth by arranging the conditions for crystal growth is called promoting crystal growth.

It is reported in Non-Patent Document 2 listed in [0010] that a crystal surface which is flat and has a steep heterointerface can be formed by the step-flow growth of a group-III nitride single crystal. Since a semiconductor device made of a group-III nitride single crystal uses a surface or heterointerface for a channel or drift region, a flat surface, flat interface, or a crystal structure with little disturbance works favorably. Non-Patent Document 2 reports that characteristics of the semiconductor device are improved by using a group-III nitride single crystal grown by step-flow growth.

It is reported in Non-Patent Document 3 listed in [0010] that the formation of deep levels can be suppressed and current collapse can be reduced by promoting the step-flow growth of a group-III nitride single crystal.

Techniques for promoting step-flow growth of a group-III nitride single crystal are taught in Non-Patent Documents 2, 4, 5 listed in [0010]. As shown schematically in FIG. 8, in these techniques, crystal growth of the group-III nitride single crystal 24 is performed on a substrate 22, this being a sapphire substrate, a SiC substrate or a GaN free-standing substrate, etc. A c-axis 22a of the substrate 22, which is the base of the crystal growth, is inclined so as not to be orthogonal to a surface 22b of the substrate 22. That is, the surface 22b which is not orthogonal to the c-axis 22a of the substrate 22 is exposed, and the crystal growth of the group-III nitride single crystal 24 is performed on the exposed surface 22b. By adjusting an angle θ formed by a normal line n of the exposed surface 22b and the c-axis 22a of the substrate 22 to an appropriate value, a c-axis 24a of the group-III nitride single crystal 24 formed by crystal growth on the exposed surface 22b is also inclined relative to the normal line n, and step-flow growth of the group-III nitride single crystal 24 is promoted. Below, the rotation angle θ from the normal line n of the exposed surface 22b to the c-axis 22a of the substrate 22 is called a miscut angle.

Techniques for promoting crystal growth of a group-III nitride single crystal on a silicon single crystal substrate are taught in Patent Document 1 listed in [0009] or Non-Patent Document 6 listed in [0010]. In these techniques, the growth of mixed crystal, such as AlN or Al(Ga, In)N on the silicon single crystal substrate is promoted, and crystal growth of the group-III nitride single crystal thereon is promoted. Non-Patent Documents 7 and 8 will be described later.

CITATION LIST

Patent Literature

Patent Document 1 JP Patent Publication No. 2009-231550

Non-Patent Documents

Non-Patent Document 1 "Mechanism of Epitaxial Growth", edited by Kazuo Nakajima, Kyoritsu Shuppan, pp. 148-150 (2003)
Non-Patent Document 2 Weiguo Hu, et. al., Superlattices and Microstructures, 46, 812 (2009)
Non-Patent Document 3 Keiichi Matsushita, et. al., MICE Technical Report, Vol. 109, No. 81, pp 69-72 (2009)
Non-Patent Document 4 X. Q. Shen, et. al., J. Crystal Growth, 300, 75 (2007)
Non-Patent Document 5 Toshio Nishida, et. al., J. Crystal Growth, 195, 41 (1998)
Non-Patent Document 6 A. Watanabe, et. al., J. Crystal Growth, 128, 391 (1993)
Non-Patent Document 7 F. Reiher, et. al., J. Crystal Growth, 312, 180 (2010)
Non-Patent Document 8 S. R. Lee et al. "Effect of threading dislocations on the Bragg peak widths of GaN, AlGaN and AlN heterolayers" Appl. Phys. Lett. 86, 241904 (2005)

SUMMARY OF INVENTION

Technical Problem

Even if the techniques for promoting step-flow growth of a group-III nitride single crystal taught in Non-Patent Documents 2, 4, 5, and the techniques for promoting crystal growth of a group-III nitride single crystal on a silicon single crystal substrate taught in Patent Document 1 and Non-Patent Document 6 are combined, it is not possible to obtain the result of step-flow growth of the group-III nitride single crystal on the silicon single crystal substrate.

FIG. 9 schematically shows events occurring in case of, following Non-Patent Documents 2, 4, 5, causing a surface 2b not orthogonal to a c-axis 2a of a silicon single crystal substrate 2 to be exposed, promoting growth of crystal 8 such as AlN or Al(Ga, In)N, etc. on the exposed surface 2b, and promoting crystal growth of group-III nitride single crystal 10 thereon.

As described in Non-Patent Document 7, even if an angle (miscut angle) is maintained between the normal line of the exposed surface 2b and the c-axis 2a of the silicon single crystal substrate 2, a c-axis 8a of the crystal 8 which grows on the exposed surface 2b becomes orthogonal to the exposed surface 2b. Consequently, a c-axis 10a of the group-III nitride single crystal 10 also becomes orthogonal to the surface 18 during crystal growth. Consequently, two-dimensional nucleation and growth of the group-III nitride single crystal 10 occurs, and the plurality of planes 18a, 18b, 18c, etc. having different heights coexist on the surface 18. Further, the level difference 20 which travels irregularly is formed.

In the current technology, an expensive substrate such as sapphire substrate, SiC substrate or GaN substrate, etc. is required in order to promote step-flow growth of group-III nitride single crystal, and an inexpensive silicon substrate cannot be utilized.

In the present specification, a technique is disclosed for promoting step-flow growth of a group-III nitride single crystal on a surface of a silicon single crystal substrate.

Solution to Technical Problem

According to a method comprising steps (1) to (5) below, a group-III nitride single crystal layer is step-flow grown on a surface of a silicon single crystal substrate.
(1) A surface of a silicon single crystal substrate is exposed such that the exposed surface is inclined with respect to a surface orthogonal to a <111> axis of a silicon single crystal. That is, a surface that is non-orthogonal with respect to the <111> axis is exposed.
(2) A layer of silicon oxide is formed on the exposed surface. In case a native oxide layer is formed, the step of forming the native oxide layer corresponds to this step.
(3) A layer of oxide having larger enthalpy of formation than silicon oxide is formed on a surface of the silicon oxide layer.
(4) Thermal processing is performed. Thereupon, oxygen contained in the silicon oxide layer moves into the oxide which has large enthalpy of formation, and the silicon oxide layer is deoxidized. Consequently, the amorphous property of the silicon oxide layer is lost, and a c-axis of the oxide is oriented to the <111> axis of the silicon single crystal substrate.
(5) Crystal growth of wurtzite group-III nitride single crystal on a surface of the layer of oxide is promoted (crystal growth conditions are wronged). Since crystal growth occurs on the surface of oxide having a miscut angle, the step-flow growth of the group-III nitride single crystal occurs.

In the technique disclosed in the present specification, a novel layered substrate can be formed which includes a silicon single crystal substrate and a wurtzite group-III nitride single crystal layer.

In a layered substrate available in the prior art, when a plane including a normal line on a surface of a silicon single crystal substrate and a <11-2> axis of the silicon single crystal was viewed in cross-section, even if the group-III nitride single crystal was grown on the silicon surface having a normal line inclined with respect to a <111> axis of the silicon single crystal, it was not possible to control the direction of a <0001> axis of the group-III nitride single crystal by means of the direction of the <111> axis of the silicon single crystal.

According to the technique disclosed in the present specification, when a plane including a normal line on a surface of a silicon single crystal substrate and a <11-2> axis of the silicon single crystal was viewed in cross-section, a layered substrate can be obtained in which a <111> axis of the silicon single crystal and a <0001> axis of the group-III nitride single crystal are inclined in the same direction with respect to the normal line.

FIG. 1 schematically shows the relationship of orientation in case of step-flow growth of a group-III nitride single crystal on a silicon surface that is not orthogonal to the <111> axis of the silicon single crystal.

In FIG. 1, n is a normal line on a surface of the silicon single crystal substrate. The <111> axis of the silicon single crystal is inclined with respect to the normal line n. A <1-10> axis and a <11-2> axis are orthogonal with respect to the <111> axis of the silicon single crystal. A plane including the <1-10> axis and the <11-2> axis is inclined with respect to the surface of the silicon single crystal substrate.

A y-axis of FIG. 1 is orthogonal to the normal line n, and is set in a position overlapping the <11-2> axis when observed along the normal line n. The <11-2> axis is within an ny-plane. An x-axis is orthogonal to the normal linen and the y-axis. The x-axis takes a direction that forms a right handed orthogonal axis.

As shown in FIG. 1, the <111> axis of the silicon single crystal and the <0001> axis of the group-III nitride single crystal are not restricted to being on an ny-plane. <111> ny of FIG. 1 is an axis in which the <111> axis is projected onto the ny-lane from a direction orthogonal to the ny-plane (x axis direction), and <0001>ny is an axis in which the <0001> axis is projected onto the ny-plane from the direction orthogonal to the ny-plane (x axis direction).

In FIG. 1, ny is a strip-shaped region extending in an arc on the ny-plane. The black circle depicted in the ny region indicates being on the ny-plane.

FIG. 2 (a) shows a diagram of a cross-sectional view of a plane containing the normal line n and the <11-2> axis of the silicon single crystal substrate (i.e., ny-plane). In the case of FIG. 2 (a), a <111>ny axis, in which the <111> axis of the silicon single crystal is viewed in cross-section at the ny-plane, is rotated θx0° in a clockwise direction from the normal line n. The <0001>ny axis, in which the <0001> axis of the group-III nitride single crystal is viewed in cross-section at the ny-plane, is rotated θx1° in a clockwise direction from the normal line n. In case the normal line n is treated as extending from bottom to top, the <111>ny axis and the <0001>ny axis are also treated as extending from bottom to top. Alternatively, the normal line n may be treated as extending from top to bottom with respect to the silicon substrate. In this case, the <111>ny axis is treated as extending from top to bottom.

In the case of FIG. 2 (a), the <111>ny axis and the <0001>ny axis are rotated in a clockwise direction from the normal line n. When θx0≠0, θx1≠0, and θx0 and θx1 are the same direction, the <111> axis of the silicon single crystal and the <0001> axis of the group-III nitride single crystal are said to be inclined in the same direction with respect to the normal line. The case of FIG. 2 (*a*) illustrates a case where θx0 and θx1 measured in a clockwise direction of rotation from the normal line are both positive. Depending on the direction of rotation taken, both, may be negative.

In the case where the <111> axis of the silicon single crystal and the <0001> axis of the group-III nitride single crystal are inclined in the same direction, as shown in (c) of FIG. 2, the <111> axis of the silicon single crystal and the <0001> axis of the group-III nitride single crystal may not overlap when viewed from the normal line n direction, and an angle θ may be formed between the two. If θx0≠0, θx1≠0, and θx0 and θx1 are the same direction, the <111> axis of the silicon single crystal and the <0001> axis of the group-III nitride single crystal are inclined in the same direction.

In the layered substrate obtained in the prior art, even if θx0≠0, the absolute value of θx1 becomes much smaller than the absolute value of θx0. In the prior art, the inclination of the <0001> axis of the group-III nitride single crystal could not be controlled by inclining the <111> axis of the silicon single crystal substrate. The layered substrate described above is obtained for the first time by the technique disclosed in the present specification.

One aspect of the layered substrate obtained by the technique disclosed in the present specification is that a SiOx layer, a layer of oxide other than SiOx, and a group-III nitride single crystal layer are stacked in sequence on a silicon single crystal substrate, wherein x<2. The oxide other than SiOx described above is preferably an oxide having larger enthalpy of formation than silicon oxide. For example, alumina is preferred, and in particular alumina with an alpha-phase alumina structure is preferred. Further, it is preferred that the layer thickness of an alumina layer is 0.5 to 20 nm.

In the present specification, as shown in FIG. 1, an axis orthogonal to the normal line n and overlapping the <11-2> axis when viewed from the direction of the normal line n is a y-axis, an axis orthogonal to the normal line n and the y-axis is an x-axis (taking a right handed direction), a plane including the normal line n and the y-axis is an ny-plane, and a plane including the normal line n and the x-axis is an nx-plane. The surface of the silicon single crystal substrate extends parallel to an xy-plane. Further, as shown in FIG. 1 and (a) and (b) of FIG. 2, an axis in which the <111> axis is projected onto the ny-plane is a <111>ny axis, an axis in which the <111> axis is projected onto the nx-plane is a <111>nx axis, an axis in which the <0001> axis is projected onto the ny-lane is a <0001>ny axis, and an axis in which the <0001> axis is projected onto the nx-plane is a <0001>nx axis. In FIG. 1, nx is a strip-shaped region extending in an arc on the nx-plane. The black circle depicted in the nx region indicates being on the nx-plane. The <1-10> axis is not restricted to being on the nx-plane, and is also not restricted to being on the xy-plane.

In FIG. 1, a rotation angle measured in the ny-plane from the normal line n to the <111>ny axis is θx0, and a rotation angle measured in the ny-plane from the normal line n to the <0001>ny axis is θx1. Further, a rotation angle measured in the nx-plane from the normal line n to the <111>nx axis is θy0, and a rotation angle measured in the nx-plane from the normal line n to the <0001>nx axis is θy1. The rotation angles described above are measured in the same direction from the normal line n. In the case of FIG. 1, a crystal axis of the silicon single crystal is shown by a rotation angle from an axis (−n axis) in the opposite direction to the normal line n. However, as shown in FIG. 2, the crystal axis of the silicon single crystal is equal to the rotation angle from the normal line n.

The case of FIG. 2 shows an example in which θx0 and θx1 are positive, and θy0 and θy1 are negative. However, the rotation angle may be positive or negative, depending on the direction of rotation taken. In the case of the layered substrate obtained by the technique of the present specification, both θx0 and θx1 have positive sign or negative sign, and both θy0 and θy1 have positive sign or negative sign. According to the technique disclosed in the present specification, as shown in (a) and (b) of FIG. 2, a layered substrate is obtained which has the relationship of absolute value of θx0>absolute value of θy0, and absolute value of θx1>absolute value of θy1.

In order to obtain the aforementioned substrate, when setting the miscut angle of the silicon single crystal substrate surface, the relationship is set such that a miscut angle to the <11-2> axis direction is greater than a miscut angle to the <1-10> axis direction. In other words, the relationship is such that the <111> axis of the silicon single crystal is primarily inclined to the <11-2> axis direction, and the <1-10> axis remains approximately within the substrate surface. In this case, the step surface of the group-III nitride single crystal grown on the substrate surface is a (1-100) plane or a (1-101) plane. When c-plane growth of the group-III nitride single crystal occurs, the (1-100) plane and (1-101) plane are stable surfaces. Consequently, when the <111> axis of the silicon single crystal is caused to incline primarily to the <11-2> axis direction, the step surface of the group-III nitride single crystal undergoing step-flow growth extends linearly, and a step and terrace shape shown in FIG. 3 (to be described) can be obtained stably.

Moreover, the technique disclosed in the present specification does not preclude inclining the <111> axis of the silicon single crystal substrate to the <1-10> axis direction. Even if the <111> axis is also inclined to the <1-10> axis direction, step-flow growth of the group-III nitride single crystal occurs.

In reality, it is difficult to incline the <111> axis only to the <11-2> axis direction, and not to the <1-10> axis direction. Inclination to the <1-10> axis direction also occurs. Even if inclination to the <1-10> axis direction occurs, if that inclination angle is small, the step surface of the group-III nitride single crystal undergoing step-flow growth becomes a stable surface, and extends linearly. The step surface of the group-III nitride single crystal undergoing step-flow growth becomes a stable surface if there is the relationship: absolute value of θx0>absolute value of θy0.

According to the technique disclosed in the present specification, a layered substrate can be obtained in which θx0 and θx1 shown in (a) of FIG. 2 satisfy the relationship θx1/θx0=0.6 to 1.0. As described above, θx0 and θx1 have the same sign.

It is preferred that the absolute value of θx0 is 0.1° or more. If the absolute value is 0.1° or more, terrace width of the group-III nitride single crystal undergoing step-flow growth does not become excessive, and two-dimensional nucleation and growth on the terraces does not start. Further, it is preferred that the absolute value of θx0 is 1.0° or less. If the absolute value is 1.0° or less, height of the steps does not become excessive. Step-flow growth at a thickness of a few atomic layers is sustained.

According to the technique disclosed in the present specification, a layered substrate can be obtained in which a surface of the group-III nitride single crystal layer has a repeated step and terrace shape.

When an average value of a terrace width of the group-III nitride single crystal is W, and a lattice constant of the <0001> axis of the group-III nitride single crystal is C, it is preferred that absolute value of (W×tan θx1) is 0.5×C to 2.0×C. Step-flow growth at a thickness of a few atomic layers is sustained.

It is known that there is little disturbance in the crystal structure of a group-III nitride single crystal obtained by step-flow growth. According to the technique disclosed in the present specification, a group-III nitride single crystal layer can be obtained in which layer thickness is 1.5 μm or less, and dislocation density (the density of dislocation which is the sum of screw dislocation and mixed dislocation) is $5 \times 10^8$ cm$^{-2}$ or less. According to the technique disclosed in the present specification, a group-III nitride single crystal layer which is thin and with few defects can be obtained.

As described above, in the prior art, also, crystal growth of group-III nitride single crystal can be promoted on a surface of a silicon single crystal substrate. In that case, the crystal growth of mixed crystal such as AlN, etc, is promoted on the surface of the silicon single crystal substrate, and the crystal growth of group-III nitride single crystal is promoted on the surface of the mixed crystal layer. In reality, since a native oxide layer is formed on the surface of the silicon single crystal substrate, the mixed crystal such as AlN, etc. is promoted to be grown on a surface of the native oxide layer. The surface of the native oxide layer is not managed, and is not flat. In the prior art, due to growing of the mixed crystal such as AlN, etc. on said unmanaged surface, many defects enter the mixed crystal undergoing crystal growth. Consequently, the defects are also propagated in the group-III nitride single crystal layer grown on the surface of the mixed crystal. Further, it is difficult to remove the native oxide layer within an apparatus for promoting a mixed crystal growth. According to the conventional technique, although it is possible to promote crystal growth of group-III nitride single crystal on the surface of a silicon single crystal substrate, the group-III nitride single crystal thus obtained has many defects, and it is not possible to promote crystal growth of clean group-III nitride single crystal.

The technique disclosed in the present specification can also be utilized to promote crystal growth of group-III nitride single crystal with few crystal defects on a silicon single crystal substrate. A layer of oxide (utilizing an oxide having larger enthalpy of formation than silicon oxide) is formed on a surface of a native oxide layer formed on a surface of a silicon single crystal substrate, the native oxide layer is deoxidized by thermal processing, and crystal growth of a group-III nitride single crystal layer is promoted thereon, thus obtaining crystal growth of group-III nitride single crystal with few crystal defects.

In case of utilizing the technique disclosed in the present specification in order to obtain group-III nitride single crystal with few crystal defects, it may be that providing a miscut angle in the silicon single crystal substrate is not essential and the step-flow growth of group-III nitride single crystal may not occur. In a case where flatness of the surface of the group-III nitride single crystal is not important but the density of defects present within the group-III nitride single crystal is important, the technique disclosed in the present specification has utility even if the step-flow growth of group-III nitride single crystal does not occur.

According to the technique disclosed in the present specification, a layered substrate was created wherein a SiOx layer, a layer of oxide other than SiOx, and a group-III nitride single crystal layer are stacked in sequence on a silicon single crystal substrate, wherein the oxide other than SiOx has larger enthalpy of formation than silicon oxide, and wherein x<2. This layered substrate comprises a group-III nitride single crystal layer having a low dislocation density.

Advantageous Effects of Invention

According to the technique disclosed in the present specification, step-flow growth of a group-III nitride single crystal is promoted on a silicon single crystal substrate, this being cheaper than a sapphire substrate or group-III nitride single crystal substrate. Low cost manufacture becomes possible of a group-III nitride single crystal layer having a flat surface and few crystal defects. Alternatively, it is possible to grow a group-III nitride single crystal layer with few crystal defects on a silicon single crystal substrate. Low cost manufacture becomes possible of a group-III nitride single crystal layer with few crystal defects.

DESCRIPTION OF EMBODIMENTS

Substantial features of the below embodiment will be summarized.
(Feature 1) θx0>>θy0, namely θx0 is much larger than θy0. That is, a <111> axis of a silicon single crystal substrate is exclusively inclined to a <11-2> direction, and is hardly inclined to a <1-10> direction.
(Feature 2) A surface of the silicon single crystal substrate is washed, is exposed to 1% hydrofluoric acid, is rinsed with pure water and then dried, thereby preparing a silicon single crystal substrate on which a thin native oxide layer is stacked on a surface.
(Feature 3) An alumina layer is formed by ALD (atomic layer deposition) method.
(Feature 4) Alternatively, an alumina layer is formed by sputtering.
(Feature 5) Thermal processing is performed at a temperature at which the alumina layer is crystallized.
(Feature 6) Thermal processing is performed at a temperature at which the alumina layer is crystallized to alpha-phase.
(Feature 7) Thermal processing is performed at 1000 to 1200° C.
(Feature 8) Thermal processing is performed in a noble gas.
(Feature 9) Epitaxial growth of group-III nitride single crystal is promoted by the metal-organic chemical vapor deposition (MOCVD) method.
(Feature 10) First, crystal growth of AlN and then crystal growth of GaN are promoted. A group-III nitride single crystal layer having a heterojunction is formed.

Embodiments (Preparation of Silicon Single Crystal Substrate)

Figure 1:
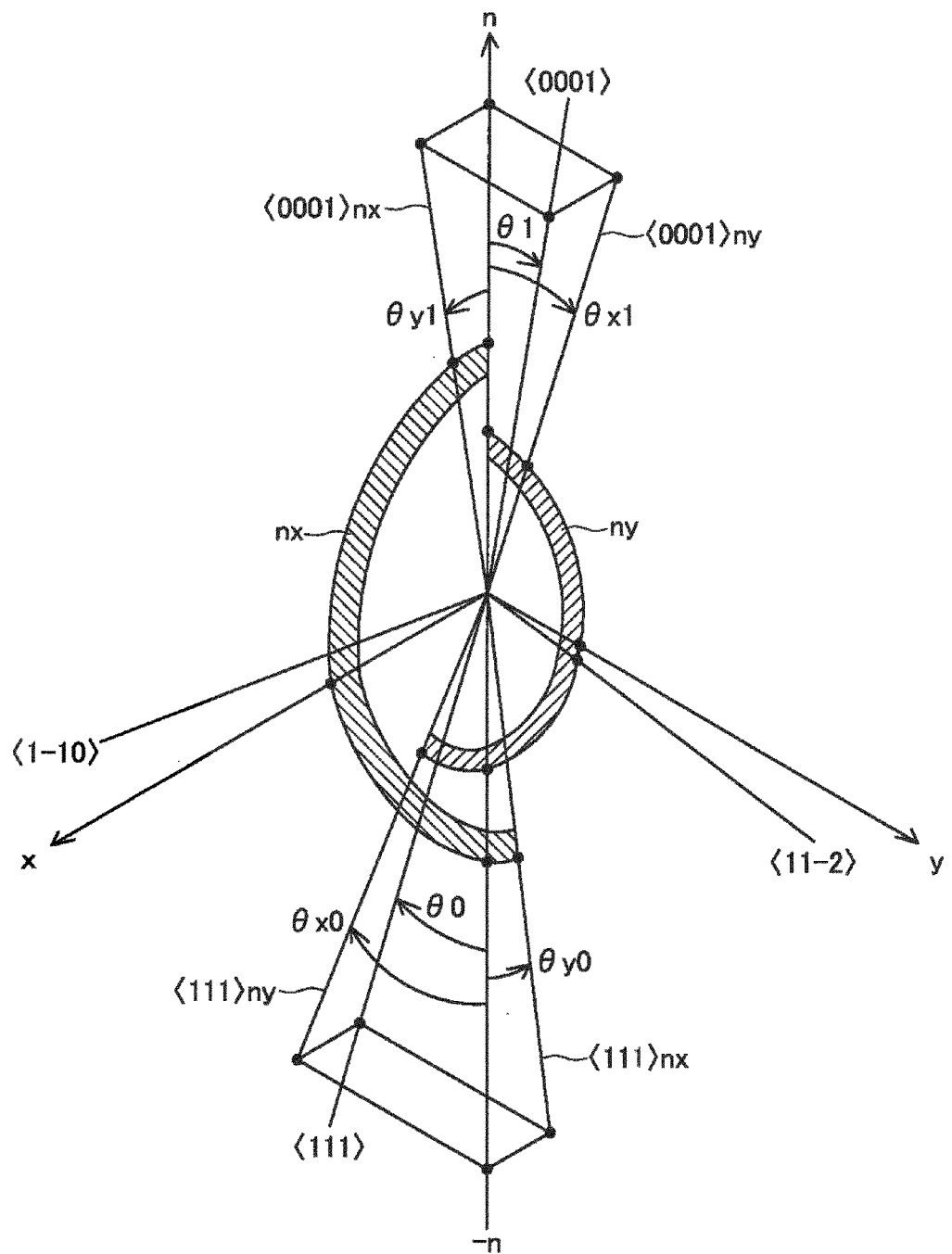
FIG. 1 shows in three dimensions the direction of a <0001> axis of group-III nitride single crystal grown by step-flow growth on a plane (xy-plane) that is not orthogonal to a <111> axis of silicon single crystal.

First, a silicon single crystal substrate having a miscut angle is prepared. At this juncture, a relationship is realized in which <11-2> axis of the silicon single crystal is inclined with respect to a substrate surface, and <1-10> axis is hardly inclined with respect to the substrate surface. That is, a surface is exposed which satisfies the relationship of a <111> axis being inclined exclusively in the <11-2> direction from a normal line on the substrate surface. That is, θy0 shown in FIG. 1 is nearly zero, and θx0 is caused to have a value. θy0 need not be precisely zero, but may have a small value.

Generally, a relationship $\tan \theta 0 = (\tan^2 \theta x0 + \tan^2 \theta y0)^{1/2}$ is satisfied. Here, θ0 is an angle formed by the normal line n and the <111> axis of the silicon single crystal. In a case where θy0 is small, θ0 and θx0 are approximately equal. An absolute value of θx0 (approximately equal to θ0) is inclined in a range of 0.1° to 1.0°. Similarly, $\tan \theta 1 = (\tan^2 \theta x1 + \tan^2 \theta y1)^{1/2}$. Here, θ1 is an angle formed by the normal line n and a <0001> axis of group-III nitride single crystal.

Figure 3:
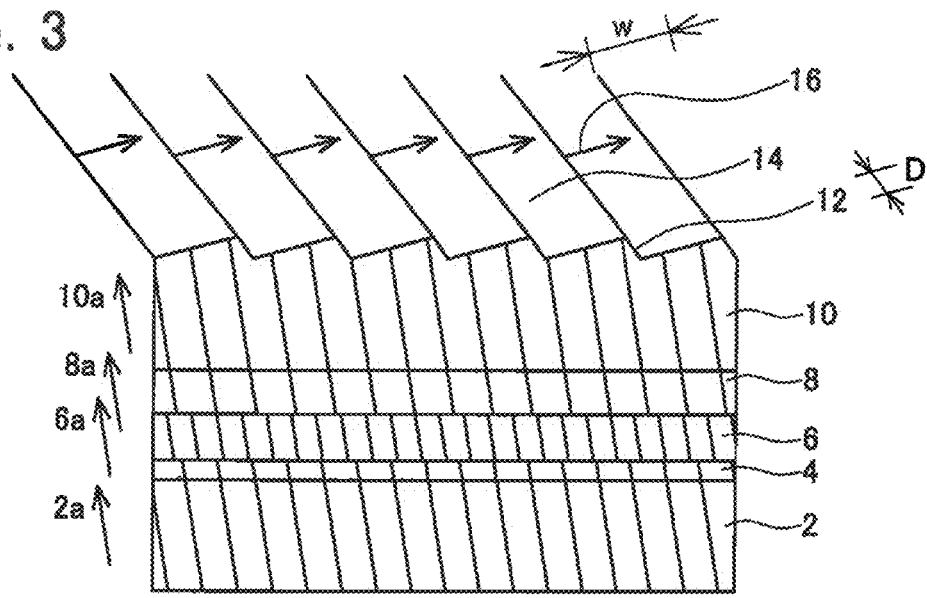
FIG. 3 schematically shows the layered structure of a layered substrate comprising a silicon single crystal substrate having a miscut angle, a silicon oxide layer having an oxidation valence less than 2, an oxide crystal with larger enthalpy of formation than silicon oxide, and group-III nitride single crystal grown by step-flow growth.
Figure 9:
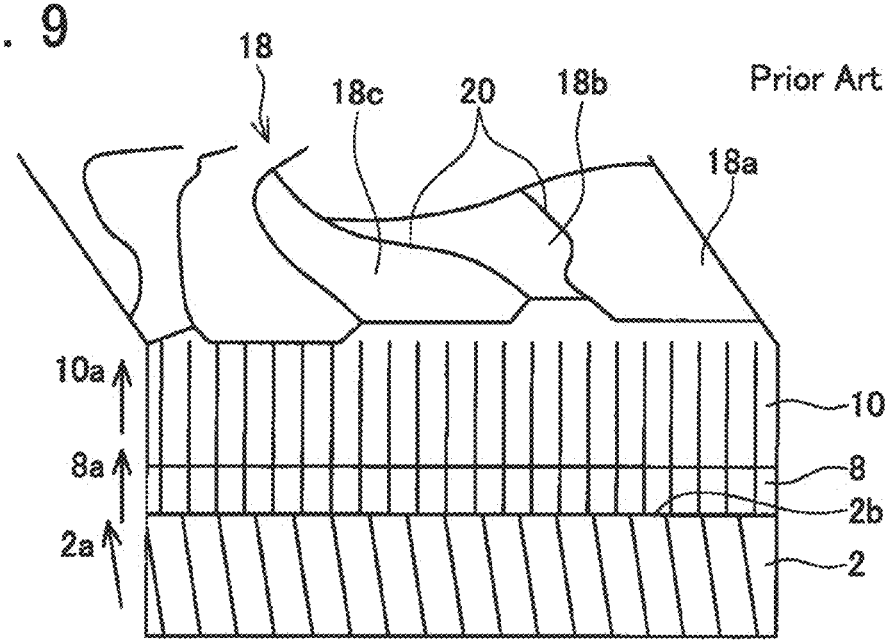
FIG. 9 shows the layered structure of a layered substrate obtained by growing group-III nitride single crystal on a silicon single crystal substrate having a miscut angle.

When absolute value of θx0 is 0.1° or less, an average value of a width W of terraces 14 shown in FIG. 3 becomes too wide (1 μm or more), two-dimensional nucleation and growth starts on the terraces 14, and there is the chance that the irregularities shown in FIG. 9 occur. When the absolute value of θx0 is 1.0° or more, an inclination angle of the terraces 14 shown in FIG. 3 becomes too large, and a height D of steps 12 becomes too large. It is known, in step-flow growth, that when a step grown at one time has a thickness of 1 or 2 atomic layers, a crystal layer with few crystal defects and a flat surface is grown (a repeated step-terrace shape that varies in thickness within a range of 1 or 2 atomic layers is macroscopically extremely flat). When the absolute value of θx0 is 1.0° or more, there is the possibility of the steps grown at one time being thick, and the step bunching phenomenon occurring.

(Creation of Silicon Oxide Layer)

When a silicon single crystal substrate having a miscut angle is prepared, usually, a native oxide layer is formed on a surface of the prepared silicon single crystal substrate. Since the native oxide layer may be too thick, the following processes are performed.

(1) The silicon single crystal substrate is washed with sulfuric acid and hydrogen peroxide, is washed with ammonia and hydrogen peroxide, and/or is washed with hydrochloric acid and hydrogen peroxide;
(2) a part of the native oxide layer is removed and thinned by exposing the silicon single crystal substrate to 1% hydrofluoric acid;
(3) the silicon single crystal substrate is rinsed with pure water and then dried.

The surface of the silicon single crystal substrate which has undergone the aforementioned processes is covered with a thin silicon oxide layer.

(Creation of Alumina Layer)

An alumina layer having a thickness of 0.5 to 20 nm is formed. For this purpose, it is preferred that the alumina layer is formed by ALD (atomic layer deposition) method. The alumina layer may be formed by the sputtering method. If the thickness of the alumina layer is 0.5 nm or less, the surface of the silicon oxide layer is not completely covered. If the thickness of the alumina layer is 20 nm or more, the orientation of the <111> axis of the silicon single crystal is not transmitted to a surface of the alumina layer even if thermal processing, to be described, is performed. In this step, it is preferred that an alumina layer having a thickness of 1 to 3 nm is formed.

(Thermal Processing)

Figure 4:
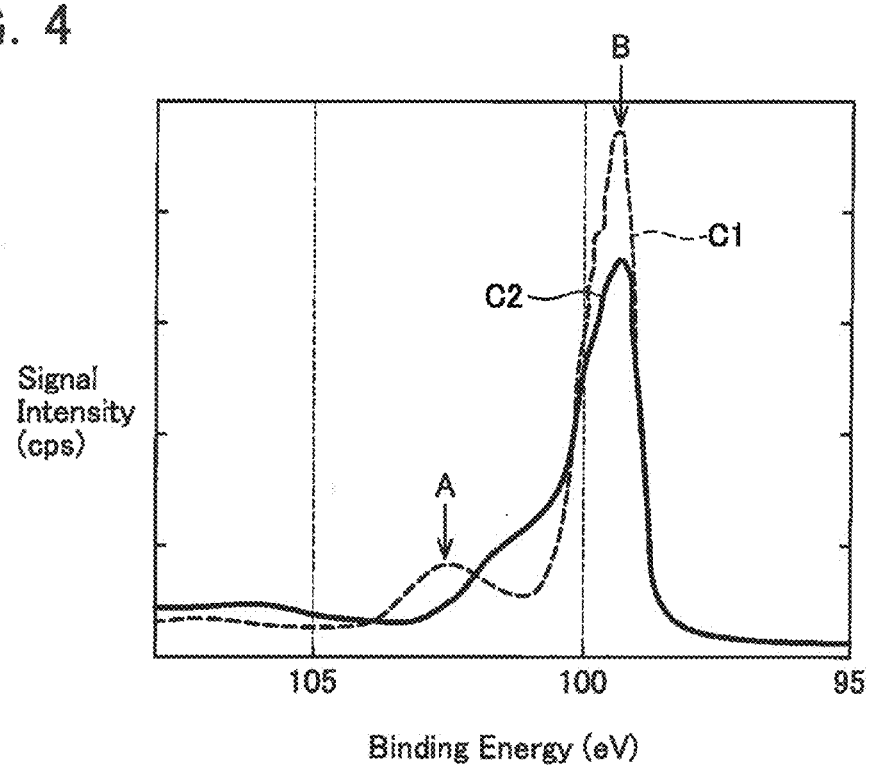
FIG. 4 shows an XPS spectrum of a silicon oxide layer before thermal processing and a silicon oxide layer after thermal processing.

Thermal processing is performed in which the silicon single crystal substrate on which the silicon oxide layer and the alumina layer have been stacked is heated to 1000 to 1200° C. Thermal processing at 1000° C. or below is insufficient, and at 1200° C. or more the Al of the alumina and the Si of the silicon oxide layer react, impairing crystalline. By performing the thermal processing, the alumina is crystallized into alpha-phase. Alumina has larger enthalpy of formation than silicon oxide, and when the alumina layer is crystallized, the adjacent silicon oxide is deoxidized, and $SiO_2$ changes into SiOx (x<2). FIG. 4 shows an XPS spectrum of the Si of the silicon oxide layer (is orbital) before thermal processing (curve C1), and an XPS spectrum of the silicon oxide layer after thermal processing (curve C2). The height of peaks A, B is reduced in the XPS spectrum (C2) after thermal processing compared to the XPS spectrum (C1) before thermal processing. XPS spectrum (C2) is similar to XPS spectrum of the silicon single crystal. By performing the thermal processing, the silicon oxide layer is deoxidized, and it is confirmed that it has been altered to SiOx (x<2).

When the silicon oxide layer is deoxidized and the alumina layer is crystallized into alpha-phase, the influence of the <111> axis of the silicon single crystal being inclined is propagated to the surface of the alumina layer, and a c-axis of the alpha-phase alumina crystal also inclines. As shown in FIG. 1, the <111> axis of the silicon single crystal is primarily inclined to the <11-2> direction. Consequently, the c-axis of the alumina crystal is also primarily inclined to the <11-2> direction.

It is preferred that thermal processing is performed in a noble gas such as argon, etc. When thermal processing is performed in a noble gas, nitriding of the silicon single crystal can be prevented.

(Alternative to Creation and Thermal Processing of Alumina Layer)

As described above, the aim of forming the alumina layer and performing thermal processing is to crystallize the oxide layer while deoxidizing the silicon oxide layer, and to align the orientation of the oxide crystal with the crystal orientation of the silicon single crystal. The material that generates this phenomenon is not restricted to the alumina layer. The phenomenon can be obtained by forming a layer of oxide having larger enthalpy of formation than the silicon oxide on the silicon oxide layer and performing thermal processing thereon. The alumina layer is a preferred embodiment, but the embodiment is not restricted to the alumina layer.

(Growth of Group-III Nitride Single Crystal)

Group-III nitride single crystal is grown by the metal-organic chemical vapor deposition (MOCVD) method on a surface of the alumina crystal in which the c-axis is inclined with respect to the surface. In the embodiment, the crystal growth of AlN, and then the crystal growth of GaN are promoted.

First, the substrate is heated to 1000 to 1100° C. in a hydrogen or nitrogen atmosphere and the growth of AlN is started. It is preferred that, at the time of starting the crystal growth of AlN, the crystal growth starts at a temperature 100° C. lower than the thermal processing temperature of alumina. When the crystal growth starts at a temperature 100° C. lower than the thermal processing temperature of alumina, nitriding of the substrate can be prevented. Then, the crystal growth of AlN is promoted using ammonia as a nitrogen source and using trimethyl aluminum as an aluminum source. The c-axis of AlN crystal grown in this manner is oriented with respect to the alumina crystal. Consequently, the AlN crystal is oriented with respect to <111> axis of the silicon single crystal having 3-fold symmetry. Since <111> axis of the silicon single crystal is inclined with respect to the substrate surface (is not orthogonal thereto), the c-axis of the AlN crystal also grows so as to be inclined with respect to the substrate surface. Consequently, as shown in FIG. 3, step-flow growth of AlN crystal 8 occurs. FIG. 3 schematically shows the layered structure of a silicon single crystal substrate 2 having a miscut angle, a deoxidized silicon oxide layer 4, a thermally processed and crystallized alumina layer 6, and an AlN layer 8 grown thereon by step-flow growth.

Moreover, the AlN layer 8 may also be grown by performing the MOCVD method at a temperature range of 400 to 800° C. Alternatively, the AlN layer 8 may be crystallized by thermal processing after an amorphous AlN layer has been formed by the ALD method.

Other group-III nitride single crystal may be epitaxially grown on a surface of the AlN layer 8. In the embodiment of FIG. 3, a GaN layer 10 is epitaxially grown. A heterojunction interface is formed between the AlN layer 8 and the GaN layer 10. The c-axis 10a of the GaN layer 10 is inclined with respect to a surface of the GaN layer 10. Consequently, step-flow growth of the GaN crystal 10 occurs, as shown in FIG. 3.

In FIG. 3, the height of the steps 12 and the inclination angle of the terraces 14 are shown in an exaggerated manner. The actual height of the steps 12 is from one to a few atomic layers, and the inclination angle of the terraces 14 is extremely small. That is, the surface of the GaN layer 10 has an extremely high degree of flatness. The crystal growth of e.g., a thin layer of $Al_xGa_yIn_{1-x-y}N$ is possible on the surface of the flat GaN layer 10. An extremely flat heterojunction interface can be obtained between the GaN layer and the layer of $Al_xGa_yIn_{1-x-y}N$. It is possible to design the composition of mixed crystal so that an $Al_xGa_yIn_{1-x-y}N$ conduction band has higher energy than a GaN conduction band. Thus, an electron cloud can be generated at the heterojunction interface of the GaN layer and the $Al_xGa_yIn_{1-x-y}N$. The heterojunction interface is extremely flat, and the mobility of elections is high. A semiconductor device can be realized in which highly concentrated electrons having high mobility along an extremely flat heterojunction interface are present (the semiconductor device consequently having a high performance).

Figure 2:
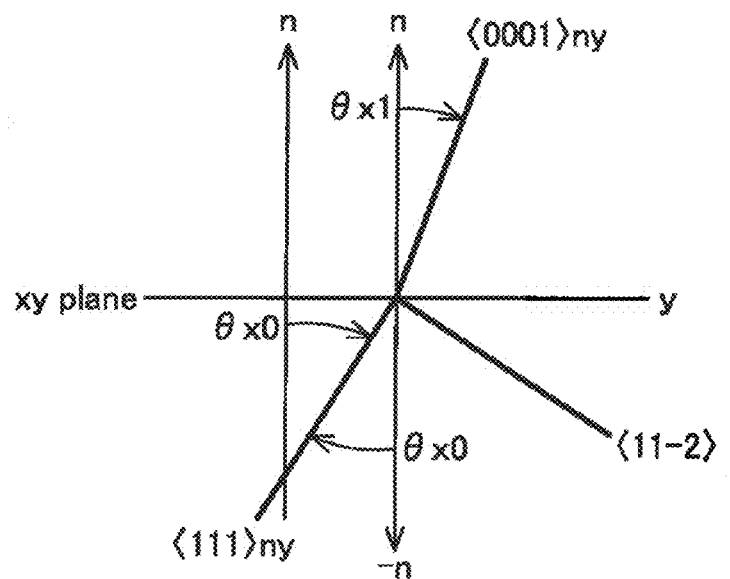
FIG. 2 (a) shows the relationship of the <111> axis and the <0001> axis viewed cross-sectionally in a plane including a normal line n and a y-axis, (b) shows the relationship of the <111> axis and the <0001> axis viewed cross-sectionally in a plane including the normal line n and an x-axis, and (c) shows the relationship of the <111> axis and the <0001> axis observed from the normal line direction.
Figure 2:
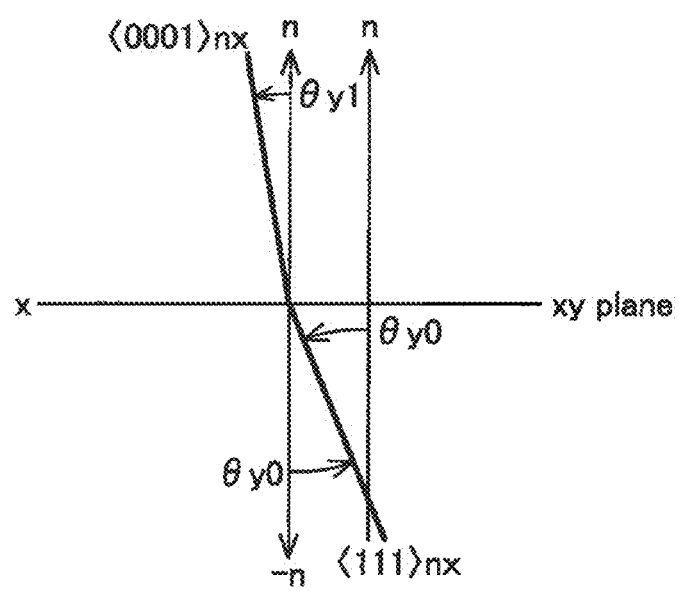
Figure 2:
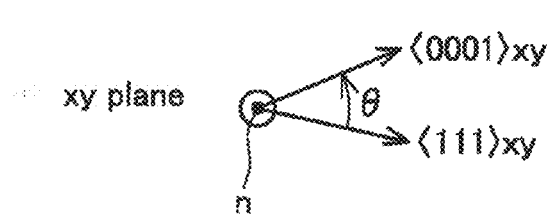

FIG. 1 shows a <0001> axis of GaN single crystal. FIG. 2 (a) shows a diagram of a cross-sectional view of a plane including the normal line n and a <11-2> axis of the silicon single crystal (ny-plane). <111>ny, in which the <111> axis is projected onto the ny-plane from the x axis direction, and <0001>ny, in which <0001> axis is projected onto the ny-plane from the x axis direction, are rotated in a clockwise direction from the normal line n, and are $\theta x0 \neq 0$ and $\theta x1 \neq 0$ as shown in the figure. <111> axis of the silicon and <0001> of the GaN are inclined to the same side (the same direction).

Figure 5:
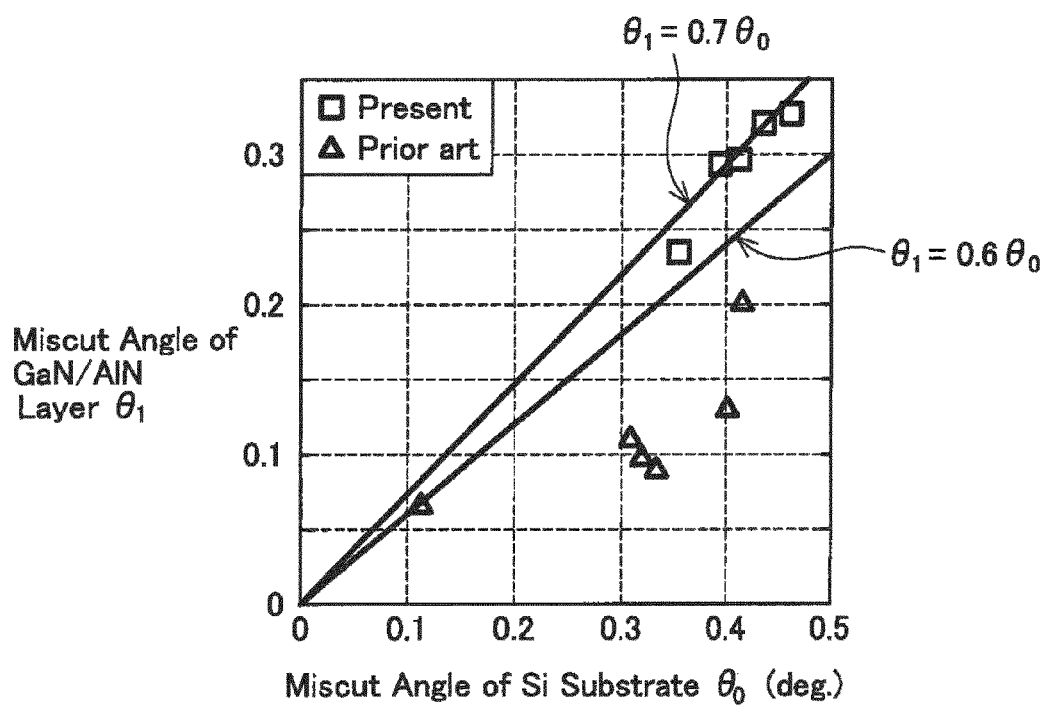
FIG. 5 shows the relationship between a miscut angle of the silicon single crystal substrate and a miscut angle of group-III nitride single crystal layer.

FIG. 5 shows the relationship between $\theta x0$ and $\theta x1$ shown in FIG. 2 (a). As described above, since $\theta y0$ and $\theta y1$ of FIG. 2 (b) are both approximately zero, $\theta x0$ is near to $\theta 0$, and $\theta x1$ is near to $\theta 1$. FIG. 5 may be said to show the relationship between $\theta 0$ and $\theta 1$. As shown in FIG. 5, according to the present embodiment, $\theta 0$ and $\theta 1$ correlate well. A relationship is established in which $\theta 1/\theta 0$ is approximately 0.6 to 0.7. The slope of a straight line indicating the relationship of $\theta 0$ and $\theta 1$ varies according to the crystal growth conditions of the GaN layer. By adjusting the growth conditions, the value of $\theta 1/\theta 0$ can be adjusted within the range of 0.6 to 1.0.

Further, as shown in FIG. 2 (c), in a plan view of the surface of the silicon single crystal substrate 2 or the GaN layer 10, an angle $\theta$ formed by the <111> axis of the silicon single crystal and the <0001> axis of the group-III nitride single crystal is approximately zero. A layered substrate can be obtained in which the orientation of the <111> axis of the silicon single crystal and the orientation of the <0001> axis of the group-III nitride single crystal are well matched.

Figure 6:
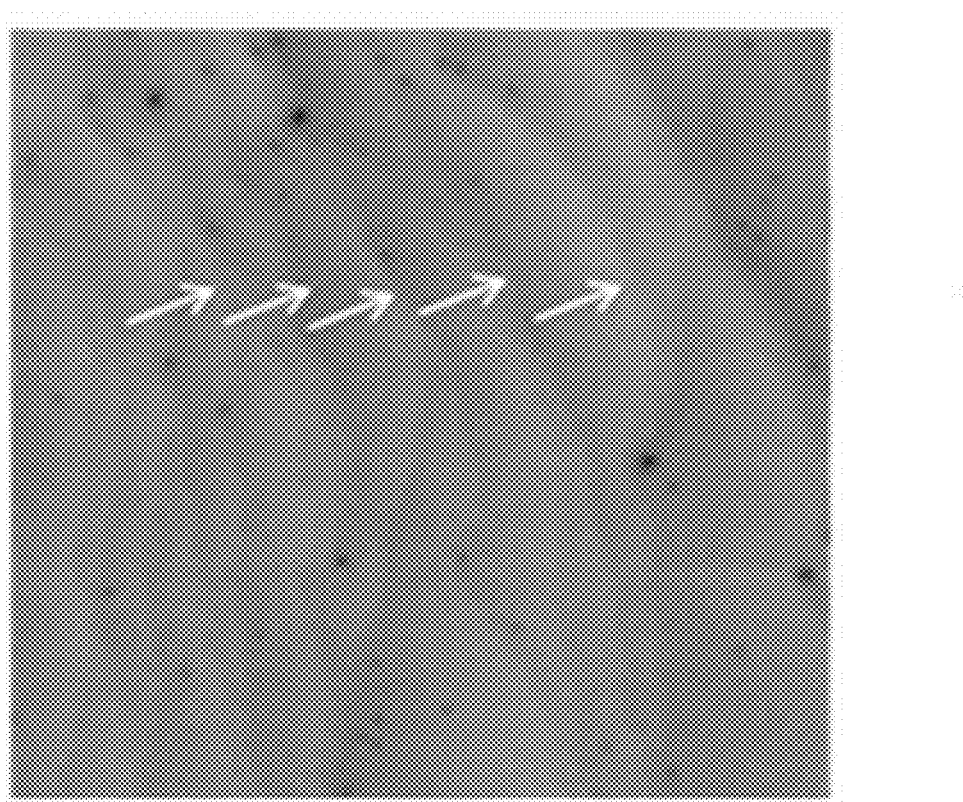
FIG. 6 is an AFM image of a surface of group-III nitride single crystal grown by step-flow growth.

FIG. 6 is an AFM image of a surface of a GaN single crystal. The repeated terrace-step shape schematically shown in FIG. 3 is actually observed. If $\theta x0$ is approximately equal to $\theta 0$, and the absolute value thereof is in the angular range of 0.1 to 1.0°, when the average value of the width of the terrace (the width of the terrace measured in a direction orthogonal to the step) is W, and the lattice constant of the <0001> axis of the GaN single crystal is C, a relationship can be obtained in which absolute value of (W×tan $\theta x1$)=0.5×C to 20.0×C. In this case, each step is grown by step-flow growth at a thickness of 2 atomic layers or less. A GaN single crystal having a flat surface and few crystal defects can be obtained. While promoting the growth of the GaN single crystal layer 10, the crystal growth of GaN single crystal doped with impurities may be obtained. In the case of step-flow growth at a thickness of 2 atomic layers or less, it is possible to control whether to introduce impurities to a group-III site or to a group-V site. It is possible to create a substrate in which not only the concentration of impurities, but also the behavior of impurities is stable.

Figure 7:
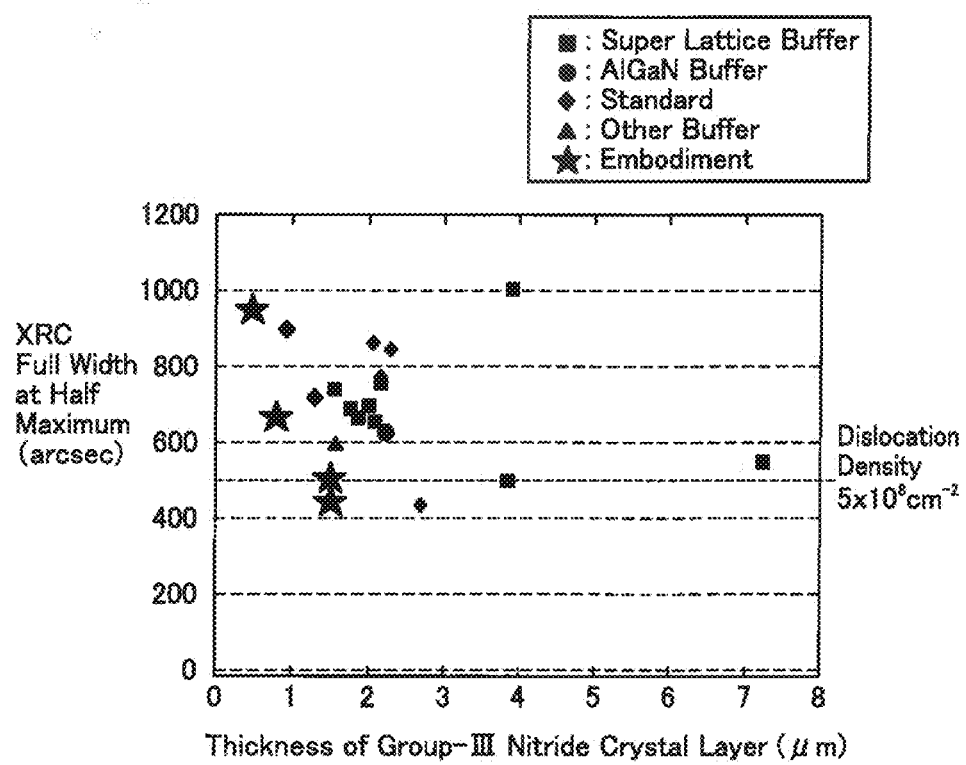
FIG. 7 shows the relationship between layer thickness and dislocation density of group-III nitride single crystal grown by step-flow growth.
Figure 8:
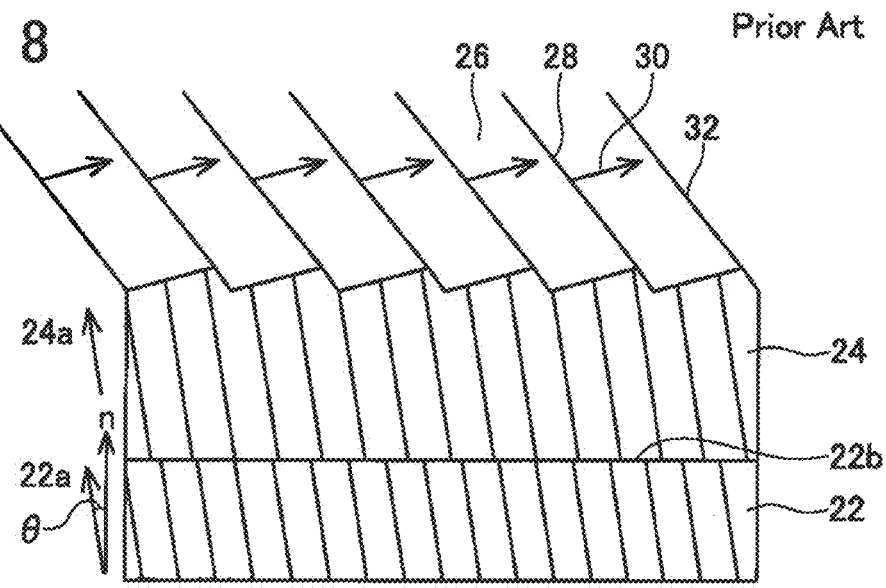
FIG. 8 shows the layered structure of a layered substrate obtained by growing group-III nitride single crystal on a group-LIT nitride single crystal substrate having a miscut angle.

FIG. 7 shows the relationship between thickness of the GaN single crystal layer 10 and XRC (x-ray rocking curve) full width at half maximum. Using samples in which AlN was grown at 1.060° C. and the crystal growth of GaN was obtained thereon, an x-ray rocking curve with 002 diffraction was measured. The full width at half maximum of a sample having a GaN layer thickness of 0.5 μm was 952 arcsec, the full width at half maximum of a sample having a layer thickness of 0.8 μm was 670 arcsec, and the full width at half maximum of a sample having a layer thickness of 1.5 μm was 449 to 514 arcsec.

Single crystal GaN could be obtained which had a layer thickness of 1.5 µm or less and had a full width at half maximum of 450 to 500 arcsec (2.2 to 2.4×10$^{-3}$ rad). The XRC full width at half maximum can be converted to the total value ρs of screw dislocation density and mixed dislocation density. Non-Patent Document 8 reports the relationship of Equation 1 below being satisfied.

$$\rho s = \Gamma^2/4.35 b^2 \qquad \text{[Equation 1]}$$

Γ=Full Width at Half Maximum (rad)
b=Length of Burgers Vector

When converting the fall width at half maximum obtained with the sample having a film thickness of 1.5 µm into dislocation density using Equation 1, the dislocation density became 5×10$^8$ cm$^{-2}$ or less. The converted dislocation density was confirmed as valid from an AFM image. In case of growing AlN directly on a silicon substrate, and growing GaN thereon, dislocation density was 5×10$^8$ cm$^{-2}$ or more when measured in the same manner as above. According to the technique disclosed in the present specification, single crystal GaN could be obtained which had a layer thickness of 1.5 µm or less and in which dislocation density was 5×10$^8$ cm$^{-2}$ or less.

According to the embodiment, it is possible to obtain a substrate in which the high quality group-III nitride single crystal layers 8, 10 having a small dislocation density are stacked on the silicon single crystal substrate 2. Various semiconductor device utilizing a group-III nitride single crystal can be manufactured by executing the processes, on this substrate, of etching gate recess, forming a gate insulating layer, forming a gate electrode, forming a source electrode and drain electrode, forming a sintered electrode, forming element isolation, and forming an interlayer dielectric, etc.

If the purpose is to obtain the high quality group-III nitride single crystal layer 10 with small dislocation density, it is not essential to set the silicon single crystal substrate at a miscut angle. The present technique can be utilized to obtain the high quality group-III nitride single crystal layer 10 with small dislocation density on the surface of a silicon single crystal substrate having no miscut angle.

In the present embodiment, as shown in FIG. 3, the GaN layer 10 is stacked above the AlN layer 8. Instead, by sequentially stacking, above the AlN layer 8, a strain relaxation layer made from AlGaN, a channel layer made from GaN, a barrier layer made from AlxInyGa1−x−yN, and a cap layer made from GaN, it is possible to create a heterojunction field-effect transistor structure. The GaN layer used as the channel layer is flat and has few crystal defects, allowing a transistor having excellent characteristics to be obtained. Alternatively, an AlGaN layer, an n-type cladding layer, a multiple quantum well active layer, a p-type electron barrier layer, and a p-type contact layer may be stacked above the AlN layer 8. The n-type cladding layer, multiple quantum well active layer, p-type electron barrier layer, p-type contact layer, etc. can be obtained by group-III nitride single crystal. According to this structure, it is possible to manufacture a light emitting diode in which the AlGaN layer functions as a strain relaxation layer. In this light emitting diode, a single crystal containing In is grown by step-flow growth, and consequently segregation of In is suppressed, improving luminous efficiency.

Figure 10:
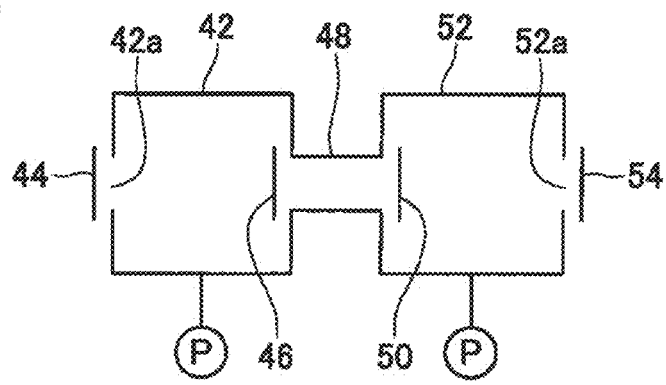
FIG. 10 schematically shows an apparatus for growing a group-III nitride single crystal layer with few crystal defects on a silicon single crystal substrate.
Figure 10:
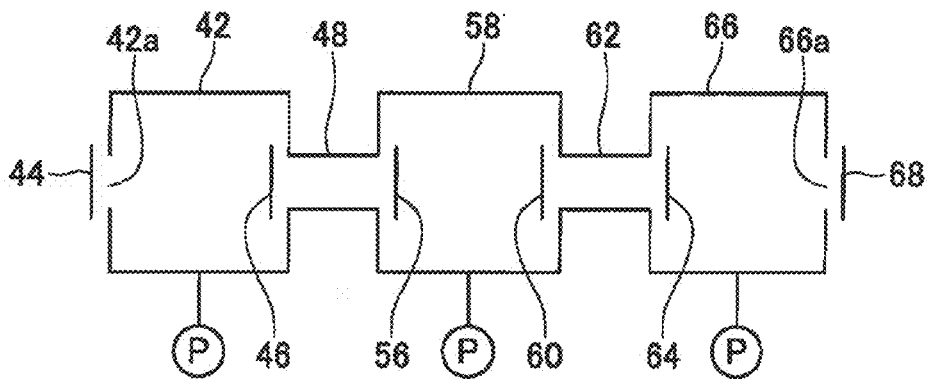
Figure 10:
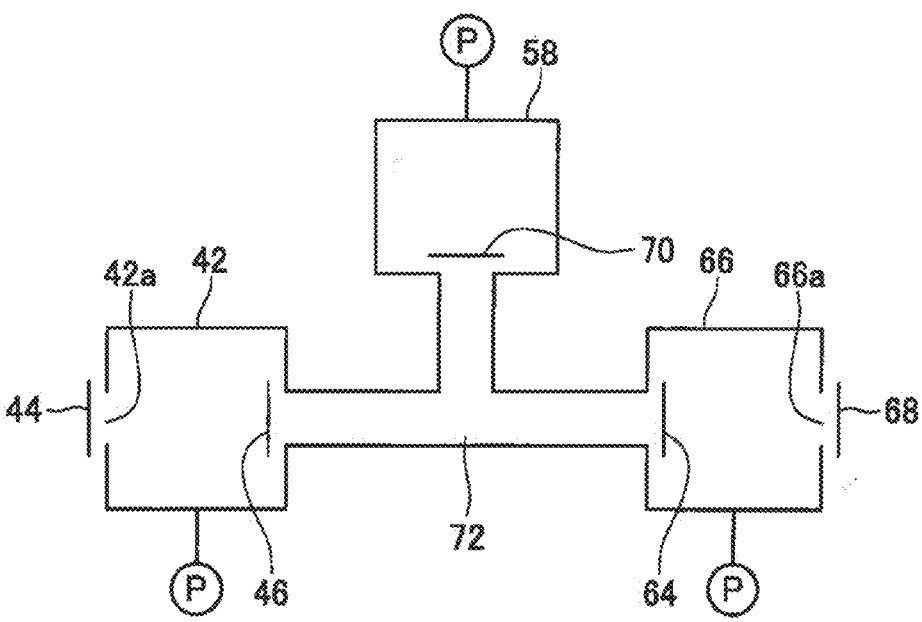

FIG. 10 schematically shows an apparatus for growing a high quality group-III nitride single crystal layer with small dislocation density on a silicon single crystal substrate.

In (1) to (3) of FIG. 10, reference number 42 indicates a chamber for forming, on a silicon single crystal substrate whose surface is covered by a silicon oxide layer, a layer of oxide having larger enthalpy of formation than silicon oxide. Reference number 52 of FIG. 10 (1) indicates a chamber for performing the thermal processing of the silicon single crystal substrate on which the layer of oxide has been formed, and further forming a group-III nitride single crystal layer. Reference number 58 of (2) and (3) of FIG. 10 indicates a chamber for performing the thermal processing of the silicon single crystal substrate, and reference number 66 indicates a chamber for foliating the group-III nitride single crystal layer. The chamber for performing the thermal processing of the silicon single crystal substrate, and the chamber for forming the group-III nitride single crystal layer may be identical, or may be provided separately. The chambers 42, 52, 58, 66 each have a vacuum pump I' attached thereto, allowing the gas type, pressure, gas flow rate, etc. within the chambers to be adjusted.

The chambers are connected to one another by transfer passages 48, 62, 72, etc. The transfer passages 48, 62, 72, etc. are also shut off from the outside air, allowing processing in which samples are not exposed to the outside air during processing. Reference numbers 46, 50, 56, 60, 64, 70, etc. are shutters for opening and closing between the chambers and the transfer passages. Reference number 42a is an opening for putting the silicon single crystal substrate on which the native oxide layer is being formed into the chamber 42, and reference number 44 is a shutter for opening and closing the opening 42a. Reference number 52a is an opening for taking out, from the chamber 52, the layered substrate on which the group-III nitride single crystal layer has been formed on the silicon single crystal substrate, and reference number 54 is a shutter for opening and closing the opening 52a. Reference number 66a is an opening for taking out, from the chamber 66, the layered substrate on which the group-III nitride single crystal layer has been formed on the silicon single crystal substrate, and reference number 68 is a shutter for opening and closing the opening 66a.

According to the manufacturing apparatus of FIGS. 10 (1) to (3), a layered substrate in which a group-III nitride single crystal layer is formed on a silicon single crystal substrate can be manufactured in a state of samples not being exposed to outside air.

Specific examples of the present invention have been described in detail, however, these are mere exemplary indications and thus do not limit the scope of the claims. The art described in the claims includes modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

REFERENCE SIGNS LIST

2: Silicon Single Crystal Substrate
2a: <111> axis
4: Silicon Oxide Layer
6: Alumina Layer
6a: c-Axis
8: AlN Layer
8a: c-Axis
10: GaN Layer
10a: c-Axis 12: Step
14: Terrace

The invention claimed is:

1. A layered substrate comprising a silicon single crystal substrate and a wurtzite group-III nitride single crystal layer, when:
an axis orthogonal to a normal line on a surface of the silicon single crystal substrate and overlapping a <11-2> axis of the silicon single crystal when observed from the direction of the normal line is a y-axis;
an axis orthogonal to the normal line and the y-axis and configuring three orthogonal axes is an x-axis;
a plane including the normal line and the y-axis is an ny-plane;
a plane including the normal line and the x-axis is an nx-plane;
an axis wherein a <111> axis of the silicon single crystal is projected onto the ny-plane is a <111>ny axis;
an axis wherein the <111> axis is projected onto the nx-plane is a <111>nx axis;
an axis wherein a <0001> axis of the group-III nitride single crystal is projected onto the ny-plane is a <0001>ny axis;
an axis wherein the <0001> axis is projected onto the nx-plane is a <0001>nx axis;
a rotation angle measured in the ny-plane from the normal line to the <111>ny axis is θx0;
a rotation angle measured in the nx-plane from the normal line to the <111>nx axis is θy0;
a rotation angle measured in the ny plane from the normal line to the <0001>ny axis is θx1; and
a rotation angle measured in the nx-plane from the normal line to the <0001>nx axis is θy1;
wherein, absolute value of θx0>absolute value of θy0, and absolute value of θx1>absolute value of θy1, and
when the ny-plane was viewed in cross-section, the <111> axis of the silicon single crystal and the <0001> axis of the group-III nitride single crystal are inclined in the same direction with respect to the normal line.

2. The layered substrate according to claim 1, wherein the group-III nitride single crystal is GaN.

3. The layered substrate according to claim 1, wherein the relationship θx1/θx0=0.6 to 1.0 is satisfied.

4. The layered substrate according to claim 1, wherein the absolute value of θx0 is 0.1° or more.

5. The layered substrate according to claim 1, wherein the absolute value of θx0 is 1.0° or less.

6. The layered substrate according to claim 1, wherein a surface of the group-III nitride single crystal layer has a step and terrace shape.

7. The layered substrate according to claim 6, when average value of a terrace width is W, and a lattice constant of the <0001> axis of the group-III nitride single crystal is C,
wherein, a relationship of absolute value of (W×tan θx1)=0.5×C to 2.0×C is satisfied.

8. The layered substrate according to claim 1, wherein layer thickness of the group-III nitride single crystal layer is 1.5 μm or less.

9. The layered substrate according to claim 1, wherein dislocation density of the group-III nitride single crystal layer is $5\times10^8$ cm$^{-2}$ or less.

10. The layered substrate according to claim 1, wherein a SiOx layer, a layer of oxide other than SiOx, and a group-III nitride single crystal layer are stacked in sequence on the silicon single crystal substrate, and x<2.

11. The layered substrate according to claim 10, wherein the layer of oxide other than SiOx is formed by an oxide having larger enthalpy of formation than silicon oxide.

12. The layered substrate according to claim 11, wherein the layer of oxide other than SiOx is an alumina layer.

13. The layered substrate according to claim 12, wherein the alumina layer is formed by an alpha-phase alumina structure.

14. The layered substrate according to claim 12, wherein layer thickness of the alumina layer is 0.5 to 20 nm.

* * * * *